United States Patent [19]
Kotani

[11] Patent Number: 5,164,696
[45] Date of Patent: Nov. 17, 1992

[54] APPARATUS FOR ELIMINATING TRAPPING OF MAGNETIC FLUX FROM AN OBJECT

[75] Inventor: Seigo Kotani, Zama, Japan
[73] Assignee: Fujitsu Limited, Kawasaki, Japan
[21] Appl. No.: 666,607
[22] Filed: Mar. 8, 1991
[30] Foreign Application Priority Data Mar. 8, 1990 [JP] Japan .................................. 2-54884

[51] Int. Cl.[5] ............................................... H01F 1/00
[52] U.S. Cl. .................................... 335/216; 335/301
[58] Field of Search ............... 335/216, 296, 301, 303, 335/304, 298, 300; 505/1, 879

[56] References Cited

U.S. PATENT DOCUMENTS

| | | | |
|---|---|---|---|
| 3,582,851 | 6/1971 | Meservey | 335/216 X |
| 4,584,549 | 4/1986 | Brown | 335/301 |
| 4,646,047 | 2/1987 | Vavrek et al. | 335/301 |
| 4,920,011 | 4/1990 | Ogawa et al. | 335/301 X |

FOREIGN PATENT DOCUMENTS

0365171 10/1989 European Pat. Off. .

OTHER PUBLICATIONS

IEEE Transactions on Magnetics, vol. 25, No. 2, Mar., 1989, pp. 2273-2275, NY, US & Superconductivity Conference 21st-25th Aug. 1988, San Francisco, U.S.; G. J. Cui et al.: "A Superconductive Shielding Can for High Tc Squid", p. 2274, Para. 1, FIG. 2.
Patent Abstracts of Japan, vol. 13, No. 198 (E-756), 11th May 1989; & JP-A-1 019 798 (Takenaka Komuten) (full abstract).
Patent Abstracts of Japan, vol. 13, No. 364 (E-805), 14th Aug 1989; & JP-A-1 122 196 (Matsushita) (full abstract).
Patent Abstracts of Japan, vol. 13, No. 103 (E-725), 10th Mar. 1989; & JP-A-63 276 293 (Hitachi) (full abstract).

Primary Examiner—Leo P. Picard
Assistant Examiner—Trinidad Korka
Attorney, Agent, or Firm—Staas & Halsey

[57] ABSTRACT

A magnetic shielding apparatus for eliminating magnetic flux from an object comprises a first superconductor wall provided at one side of the object and a second superconductor wall provided at the other, opposing side of the object and so as to intersect with the interlinking magnetic flux passing through the object. The first and second superconductor walls experience a transition from a normal conduction state to a superconduction state upon cooling below a critical temperature, and each of the first and second superconductor walls has first and second movable members movable in a direction perpendicular to the magnetic flux between a first position in which the first and second movable members conceal the object and a second position in which the first and second movable members form an aperture that exposes the object. Further, there is provided a driving mechanism connected mechanically to the first and second movable members of the first and second superconductor walls for moving the same between the first and second positions, and a cooling head connected to each of the first and second movable members of the first and second superconductor walls for cooling the same below the critical temperature.

15 Claims, 9 Drawing Sheets

APPARATUS FOR ELIMINATING TRAPPING OF MAGNETIC FLUX FROM AN OBJECT

BACKGROUND OF THE INVENTION

The present invention relates in general to superconducting circuits, and in particular to an apparatus for shielding a superconducting integrated circuit chip from external magnetic fields.

The logic gates that use the Josephson devices operate with an extremely fast speed and are expected to play a key role in the ultra-fast computers and processors of the future. Particularly, and for this reason, there are intensive efforts made to fabricate the superconducting integrated circuits that use Josephson devices wherein niobium (Nb) or its alloy is used for the Josephson junction.

Generally, the Josephson devices are extremely sensitive to magnetic fields and are used for extremely high-sensitive magnetometers capable of detecting a magnetic field of $10^{-10}$ times smaller than the earth's magnetic field.

On the other hand, the ultra-high sensitivity of the Josephson devices to magnetic fields raises a problem when one uses the Josephson devices for constructing a computer system. The operation of the Josephson devices, used in the form of superconducting integrated circuits, would be influenced when there is an external magnetic flux trapped in the Josephson devices. More specifically, such a trapped magnetic flux is pinned in the Josephson devices and modifies the operational characteristics thereof significantly. When this occurs, the switching operation of the logic devices is influenced unwantedly, and the processor would be caused to malfunction. Unless the trapping of the magnetic flux is eliminated, the Josephson processor continues operating erroneously.

Because of the foregoing reason, the superconducting integrated circuit chips are generally placed in a magnetic shield enclosure such that no external magnetic fields can penetrate into the Josephson devices.

Figure 1:
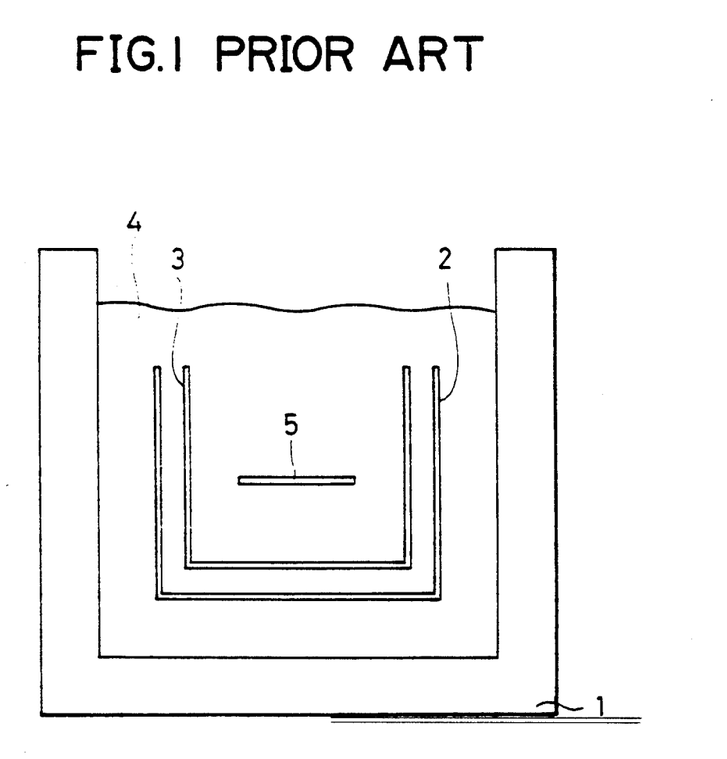
FIG. 1 is a diagram showing a conventional construction for eliminating the magnetic flux interlinking an object.

FIG. 1 shows a conventional magnetic shield enclosure used for this purpose.

Referring to FIG. 1, liquid helium 4 is filled in a Dewar vessel 1 in which first and second magnetic shield vessels 2 and 3 are immersed to form a double wall enclosure against the external magnetic fields. Further, in the space formed within the inner vessel 3, a superconducting integrated circuit chip 5 is accommodated in contact with the liquid helium 4.

The vessels 2 and 3 are formed from a material such as permalloy (registered trademark of Western Electric, Inc.) which exhibits a high permeability in the low temperature environment. The construction of FIG. 1 may have a cap of permalloy (not shown) to close the top of the vessels 2 and 3. In this construction, the external magnetic fluxes are collected by the vessels 2 and 3 and the space within the vessel 3, in which the superconducting integrated circuit chip 5 is accommodated, becomes substantially free from magnetic flux.

Figure 2:
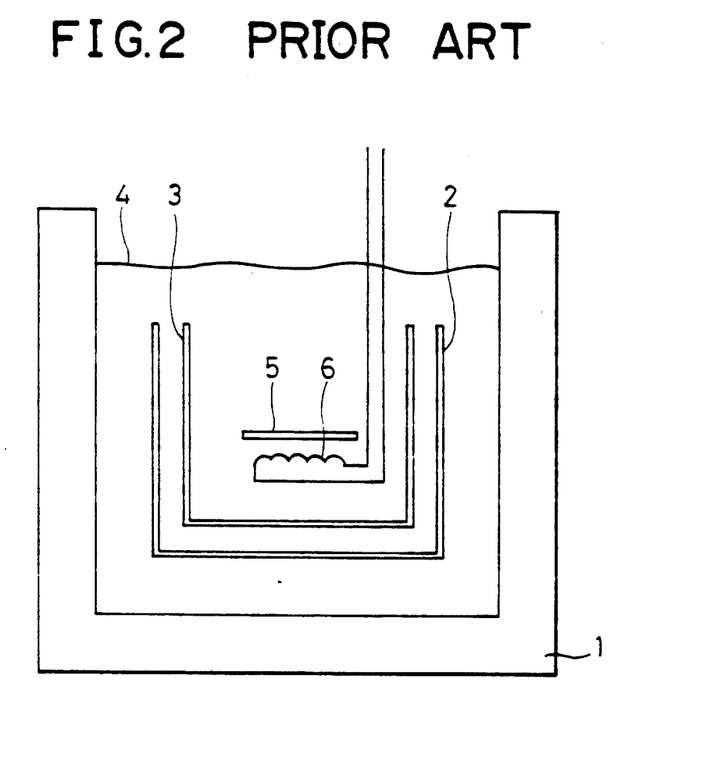
FIG. 2 is a diagram similar to FIG. 1 showing another conventional construction for eliminating the magnetic flux from an object.

FIG. 2 shows another conventional construction of a magnetic shield enclosure, wherein there is provided a heating fixture 6 in the space of the vessel 3 adjacent to the superconducting integrated circuit chip 5 to heat the chip 5 to the normal conduction state before operating the same in the superconduction state. The heating fixture 6 is configured to induce a temperature gradient within the chip 5 such that, upon cooling to the superconduction state after the foregoing transition to the normal conduction state, the superconduction state appears at a location inside the chip 5 and develops laterally along the chip 5. Thereby, the region of the superconduction state expels the magnetic flux by the Meissner effect and the magnetic fluxes that interlink the chip 5 are expelled from the chip 5.

In either the construction of FIG. 1 or FIG. 2, satisfactory magnetic shielding is not obtained when a single vessel is employed. Thus, in order to achieve the desired magnetic shielding, it is necessary to increase the number of vessels. However, the vessel itself creates a small magnetic flux, and because of this, the magnetic flux penetrating the space around the chip 5 cannot be reduced below $10^{-4}$ of the earth's magnetic field. Even in the case of achieving the foregoing reduction of the magnetic flux, which is not satisfactory, one needs to use utmost care in the manufacturing of the vessels 2 and 3 with respect to the form thereof and internal strain therein such that the efficiency of magnetic shielding is maximized. When there is a remaining magnetic flux produced by the vessel itself, such a magnetic flux may be trapped again upon cooling of the chip 5 made after the transition to the normal conduction state. Thereby, the problem of the undesirable modification of the operational characteristic of the Josephson devices remains uneliminated. Further, the heating of the chip 5 by the heating fixture 6 inevitably causes a loss of the liquid helium. When the Josephson devices are subject to the influence of external magnetic fields as such, the logic processors utilizing the Josephson devices inevitably cause malfunctioning which is detrimental to the computer system.

SUMMARY OF THE INVENTION

Accordingly, it is a general object of the present invention to provide a novel and useful apparatus for shielding an object from external magnetic fields wherein the foregoing problems are eliminated.

Another and more specific object of the present invention is to provide an apparatus for shielding an object from external magnetic fields wherein a complete elimination of any magnetic field that interlinks the object is achieved with a simple construction.

Another object of the present invention is to provide an apparatus for shielding an object from external magnetic fields, comprising an enclosure of a material that experiences a transition from the normal conduction state to the superconduction state when cooled from a first temperature to a second, lower temperature, wherein the enclosure has at least a movable wall portion that is movable between a first position and a second position, said movable wall portion exposing the object placed inside the enclosure in said first position while covering the object when in the second position. According to the present invention, the magnetic fluxes that interlink the movable wall portion are pinned therein upon the transition to the superconducting state associated with the cooling from the first temperature to the second temperature, and the pinned magnetic fluxes are moved away from the object with the movement of the movable wall portion from the first position to the second position. By maintaining the object in the normal conduction state during this process, the magnetic fluxes that pass through, i.e., interlinks with, the object move substantially freely in response to the movement of the movable wall portion. Thereby, the magnetic flux that interlinks the object is entirely eliminated. When the object is cooled to the superconduction state after this process, there remains no trapped flux in the object. When a superconducting integrated circuit is used for the object, it would be obvious that the superconducting integrated circuit thus processed is entirely free from the trapping of magnetic flux.

Other objects and further features of the present invention will become apparent from the following detailed description when read in conjunction with the attached drawings.

DETAILED DESCRIPTION

First, the principle of the present invention will be described with reference to FIG. 3(A) through FIG. 5(B) showing the essential part of a first embodiment of the present invention.

Figure 3A:
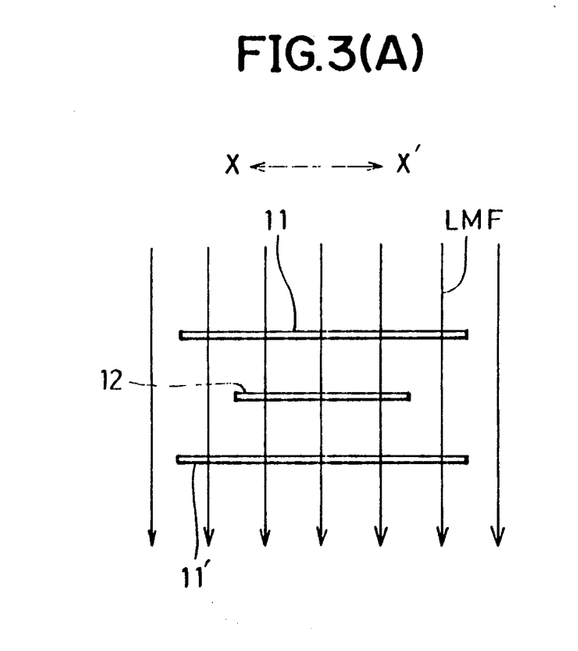
FIGS. 3(A) and 3(B) are diagrams showing the essential part of a first embodiment of the present invention in a first step of the process of eliminating the magnetic flux from an object.

Referring to FIG. 3(A), a superconducting integrated circuit chip 12 is placed in a space formed between an upper shutter mechanism 11 and a lower shutter mechanism 11' both having a planer shape, while there are a number of magnetic fluxes LMF interlinking the shutter mechanisms 11 and 11' as well as passing through the superconducting integrated circuit chip 12. It should be noted that FIG. 3(A) shows the normal conduction state wherein the magnetic flux LMF passes freely through the shutter mechanisms 11, 11' and the circuit chip 12.

In the construction of FIG. 3(A), the upper and lower shutter mechanisms 11 and 11' are formed of a superconductor such as Nb which exhibits, superconductivity in the temperature range below a critical temperature of the normal conduction-superconduction transition. When Nb is used, the critical temperature is about 9° K. The shutter mechanisms 11 and 11' also may be made of so-called high Tc superconductors that has a critical temperature substantially higher than 9° K.

Figure 3B:
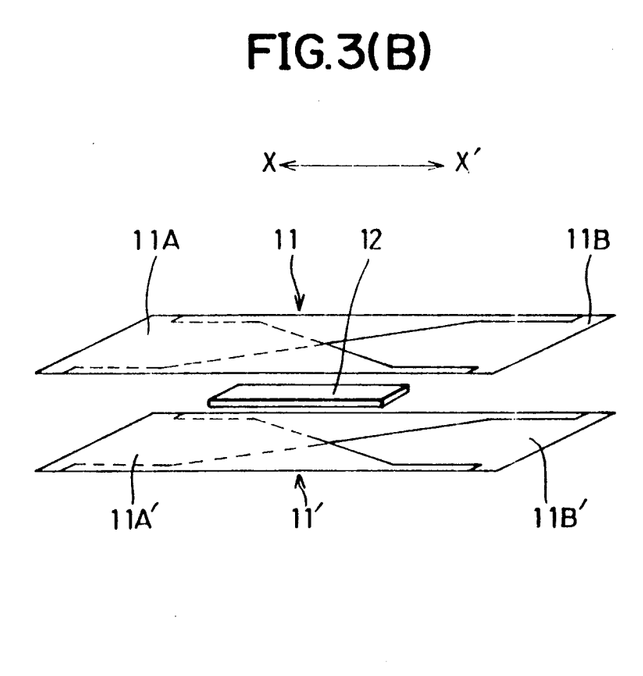

FIG. 3(B) shows the construction of the shutter mechanisms 11 and 11' of FIG. 3(A) in a perspective view. Referring to FIG. 3(B), the shutter mechanism 11 comprises a first movable shutter blade 11A and a second movable shutter blade 11B, both formed of a superconductor as already described. Similarly, the shutter mechanism 11' comprises a first movable shutter blade 11A' and a second movable shutter blade 11B' both formed of the superconductor.

As will be described later, the shutter blades 11A and 11B are movable with respect to each other in a direction X—X' such that, when they are pulled apart, there is formed an aperture (not shown in FIG. 3(B)) in correspondence to the chip 12. When they are pushed together, on the other hand, the aperture is closed. FIG. 3(B) shows the blades in the state in which the first blade pair 11A and 11B as well as the second blade pair 11A' and 11B' are pushed together, forming respective, continuous and aperture-free structures. Thereby, the superconducting circuit 12 is, when viewed in a direction perpendicular to the respective major surface 9 of the shutter mechanisms 11 and 11', completely hidden. As already noted, the shutter mechanisms 11 and 11' as well as the superconducting circuit 12 are in the normal conduction state and the magnetic flux LMF passes through the blades 11A, 11B', 11A'and 11B" as well as through the superconducting circuit 12 substantially freely.

Figure 4A:
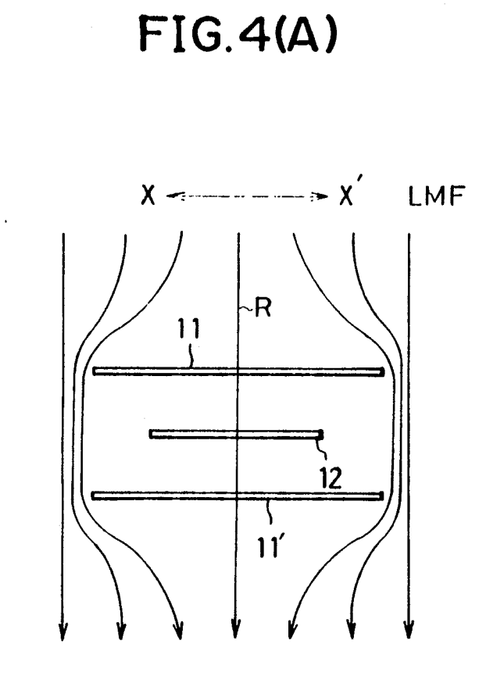
FIGS. 4(A) and 4(B) are diagrams corresponding to FIGS. 3(A) and 3(B) showing a second step of the process for eliminating the magnetic flux from the object.
Figure 4B:
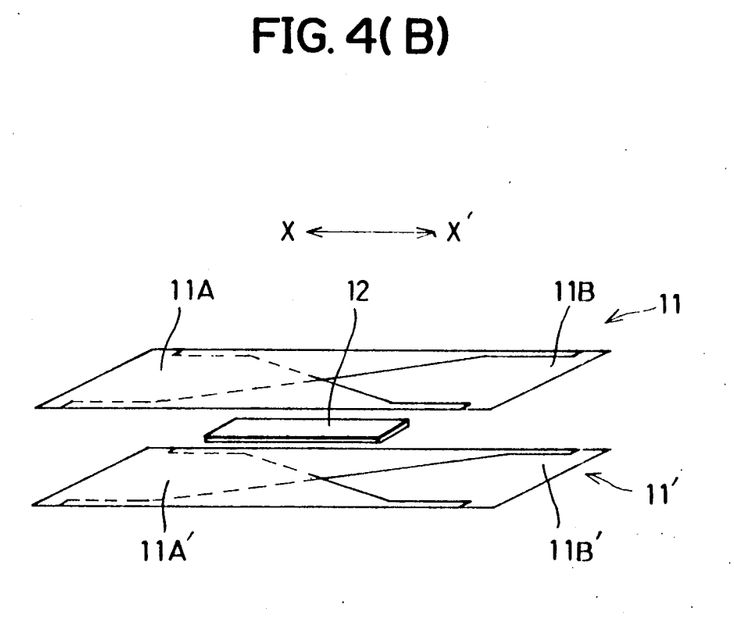

Next, while maintaining the geometric relationship of FIG. 3(B), the temperature of the shutter mechanisms 11 and 11' is decreased below the critical temperature of the normal conduction-superconduction transition. The cooling of the shutter mechanisms 11 and 11' is performed such that the circuit chip 12 remains in the normal conduction state. In response to the cooling, there appears a region of superconduction in each of the shutter mechanisms 11 and 11' and such a region grows laterally along the shutter mechanisms in the direction X—X'. As a result of the growth of the superconducting region in the shutter mechanisms 11 and 11', the magnetic flux LMF is expelled or pushed aside by the Meissner effect, and there appears a deflected pattern in the magnetic flux LMF as shown in FIG. 4(A) such that the magnetic flux avoids the shutter mechanisms 11 and 11' as well as the superconducting circuit chip 12 held therebetween. It should be noted that the superconducting circuit chip 12 is still held in the normal conduction state in this step, and the expulsion of the magnetic flux LMF from the circuit chip 12 is achieved without resistance.

It should be noted that, during such a cooling process, some of the magnetic fluxes LMF may be trapped in the superconductor forming the shutter mechanisms 11 and 11' as shown by a symbol R in FIG. 4(A) because of the defects included in the shutter mechanisms 11 and 11' or because of the non-uniform cooling. More specifically, when the cooling is made non-uniform, there may be formed a number of isolated regions of normal conduction state like islands surrounded by the region of superconduction state, and the magnetic fluxes that have failed to be swept out from the chip 12 are collected in such an island-like region. With the growth of the superconduction region in the shutter mechanism 11 or 11', the size of such a normal conduction region is reduced. However, the region never disappears and instead acts as a nucleus for pinning the magnetic flux.

With the existence of the residual magnetic flux R pinned as such, there is a substantial risk of the magnetic flux R being trapped in the superconducting integrated circuit chip 12 upon the cooling to the superconducting state. Conventionally, elimination of the residual magnetic flux R has been extremely difficult.

Figures 5A, 5B:
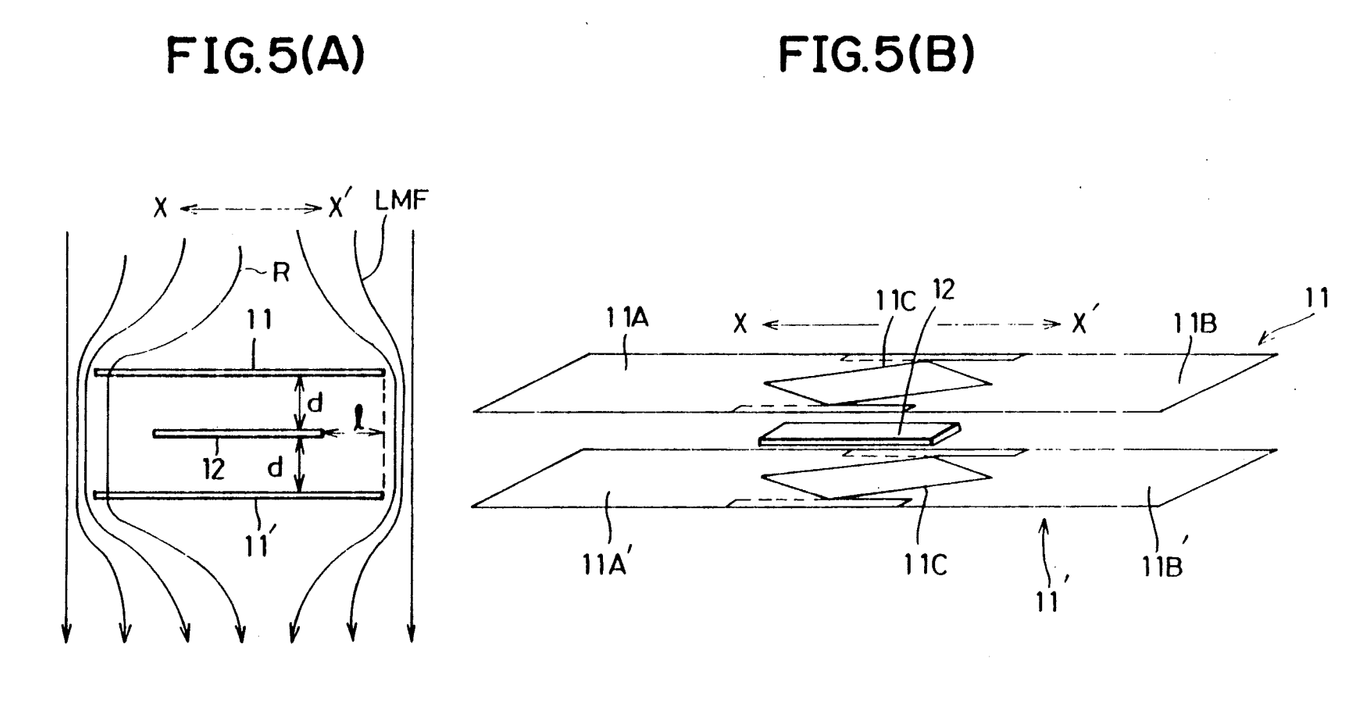
FIGS. 5(A) and 5(B) are diagrams corresponding to FIGS. 3(A) and 3(B) showing a third step of the process for eliminating the magnetic flux from the object.

The present invention eliminates the residual magnetic flux R by moving the shutter blades 11A and 11B as well as the shutter blades 11A' and 11B' apart from each other in the X—X' direction. Thereby, an aperture 11C shown in FIG. 5(B) is formed in the shutter mechanism 11 as a result of the movement of the shutter blade 11A in the X-direction and the movement of the shutter blade 11B in the opposite, X-direction. Similarly, an aperture 11C' is formed in the shutter mechanism 11'. It should be noted that the apertures 11C and 11C' are formed in correspondence to the superconducting integrated circuit chip 12 such that the entire chip 12 is exposed when viewed in the direction perpendicular to the major surface of the mechanism 11 or 11'.

With the movement of the shutter blades 11A and 11B as well as the shutter blades 11A' and 11B', it should be noted that the pinned magnetic flux R is moved also. In the example of FIG. 5(A), the residual magnetic flux R, hitherto at the center of the shutter mechanisms 11 and 11' as shown in FIG. 4(A), is moved to the left with the movement of the shutter blade 11A in the X-direction. Thereby, the magnetic flux R is now offset from the chip 12. It should be noted again, that during this step, the superconducting integrated circuit chip 12 is still in the normal conduction state and the magnetic flux R can move substantially freely in the X—X' direction. Thereby, any magnetic flux that has been interlinking the superconducting integrated circuit chip 12 is completely eliminated and the problem of trapping of the magnetic flux in the chip 12 is entirely eliminated even when the chip 12 is cooled subsequently to the superconduction state. Thus, the present invention utilizes the effect of pinning of the magnetic flux in the superconductor body positively for elimination of interlinking magnetic flux.

Figure 6:
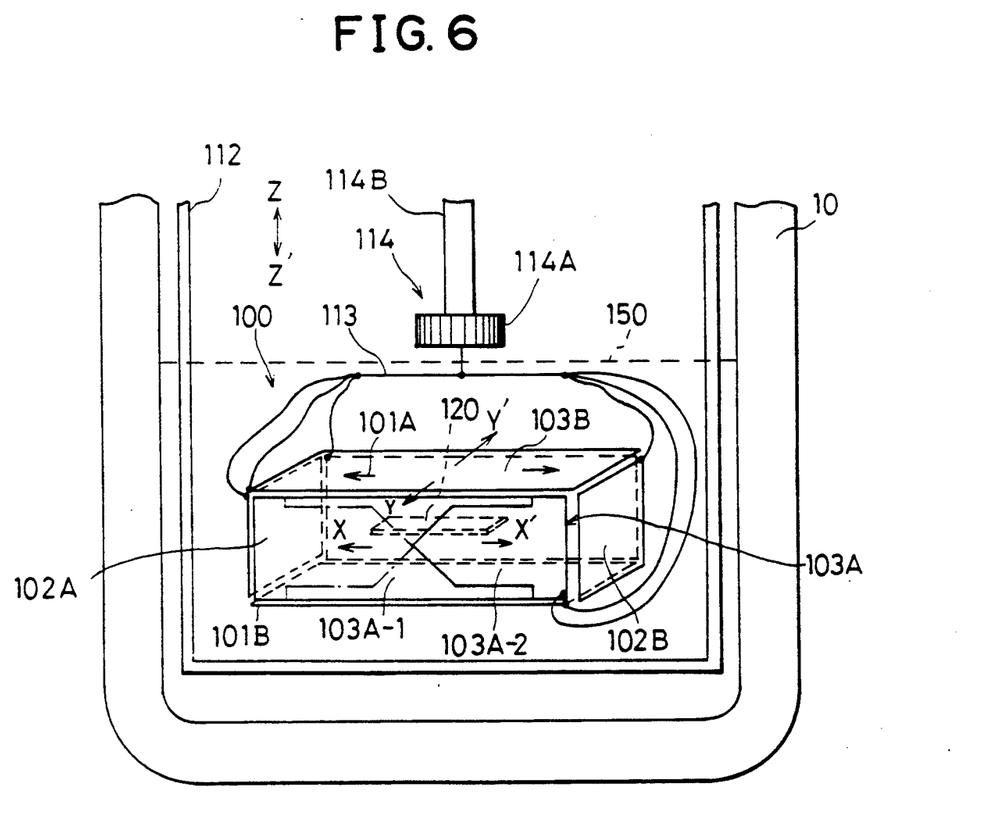
FIG. 6 is a diagram showing the overall construction of the apparatus of the first embodiment.

Next, a first embodiment of the present invention will be described with reference to FIG. 6 showing the overall construction of the present invention.

Referring to FIG. 6, the apparatus of the present embodiment comprises a Dewar vessel 10 for holding the liquid helium coolant. In the vessel 10, there is provided a conventional magnetic shield enclosure 112 of permalloy similar to the one described with reference to FIG. 2, and in the interior space defined by the magnetic shield 112, there is provided a second magnetic shield enclosure 100.

The second magnetic shield enclosure 100 defines a second interior space for holding a superconducting integrated circuit chip 120 together with a package holding the same, and comprises an upper superconductor enclosure wall 101A, a bottom superconductor enclosure wall 101B, a left superconductor enclosure wall 102A, a right superconductor enclosure wall 102B, a front superconductor enclosure wall 103A and a rear superconductor enclosure wall 103B, all of Nb. Thereby, the front superconductor enclosure wall 103A is formed from a first shutter blade part 103A-1 and a second shutter blade part 103A-2 that are assembled in a relatively movable or slidable manner in the X—X' direction with respect to each other as shown in FIG. 6. A similar pair of movable shutter blades are also provided on the superconductor enclosure wall 103B, although they are not shown for the sake of simplicity of the drawing. Further, such movable shutter blades are provided also on the upper superconductor enclosure wall 101A and the lower superconductor enclosure wall 101B. It should be noted that such superconductor shutter blades on the walls 101A and 101B are essential, as these walls cover the major surface of the superconducting integrated circuit chip 120 wherein the probability of trapping of the residual magnetic flux R becomes maximum because of the large cross-sectional area. FIG. 6 shows the enclosure 100 in the state that all the shutter blades are moved to hide the circuit chip 12 completely against the outside of the enclosure 100.

In the space within the magnetic shield enclosure 112, there is provided a chilling head 114 comprising a cooling fin part 114A and a coolant circulating pipe 114B. The chilling head 114 is supplied with a mist of liquid helium from an outer cooling unit that may be a refrigerator with a compressor, and removes the heat inside the space by evaporation of the liquid helium. The chilling head 114 is connected thermally to each of the superconducting enclosure walls 101A-103B via a thermal conductor strip 113 such as a copper ribbon.

In operation, the vessel 10 is filled first with helium gas and the refrigerator-compressor unit is started. Thereby, the superconducting enclosure walls 101A-103B are cooled preferentially via the thermal conductor strip 113. With the lowering of the temperature to below 9° K., the superconductor walls 101A-103B surrounding the chip 120 cause the transition to the superconducting state first, and the magnetic fluxes that interlink the superconductor walls are either expelled by the Meissner effect or pinned therein. Further, the shutter blades on the walls described with reference to FIG. 3(B)–FIG. 5(B) are moved in respective opposite X—X' directions to expose the superconducting integrated circuit chip 120. Thereby, the residual magnetic fluxes similar to the flux R shown in FIG. 4(A) are moved as shown in FIG. 5(A) together with the movement of the shutter blades, and the circuit chip 120 is exposed through the apertures that correspond to the apertures 11c and 11c' of FIG. 5(B) formed in the walls 101A and 101B. In a typical example, the chip 120 may have a size of 3 mm × 3 mm and be accommodated in a package having a size of 5 × 5 cm. The apertures are formed such that at least a part of the package that holds the chip 120 is exposed to the outside. More specifically, the apertures are formed such that one can see the part of the package that holds the chip from the outside of the enclosure 100 through the apertures. Thereby, the residual magnetic fluxes that are trapped in the shutter blades are entirely removed.

As noted already, the chip 120 is still in the normal conduction state in this step and the removal of the magnetic flux from the chip 120 can be achieved without substantial resistance. This is because the liquid helium is not yet formed and there can exist a substantial thermal gradient in the gaseous helium surrounding the chip 120.

With the further operation of the refrigerator unit, liquid helium starts to fill the bottom of the vessel 10. When the liquid helium reaches a predetermined level 150 slightly below the chilling head 114, the chip 120 is entirely immersed in the liquid helium and becomes operational in the superconducting state. When the superconducting circuit is operated under this condition, the erroneous operation caused by the trapping of residual magnetic flux is entirely eliminated.

Next, the construction of the superconductor enclosure walls as well as the shutter blade forming the enclosure wall will be described with reference to FIG. 7 through 9. For the sake of simplicity, only the shutter blades 103A-1 and 103A-2 provided on the wall 103A will be described. It should be noted, however, that a similar construction is employed for the shutter blades on the enclosure walls 101A and 101B as well.

Figure 7:
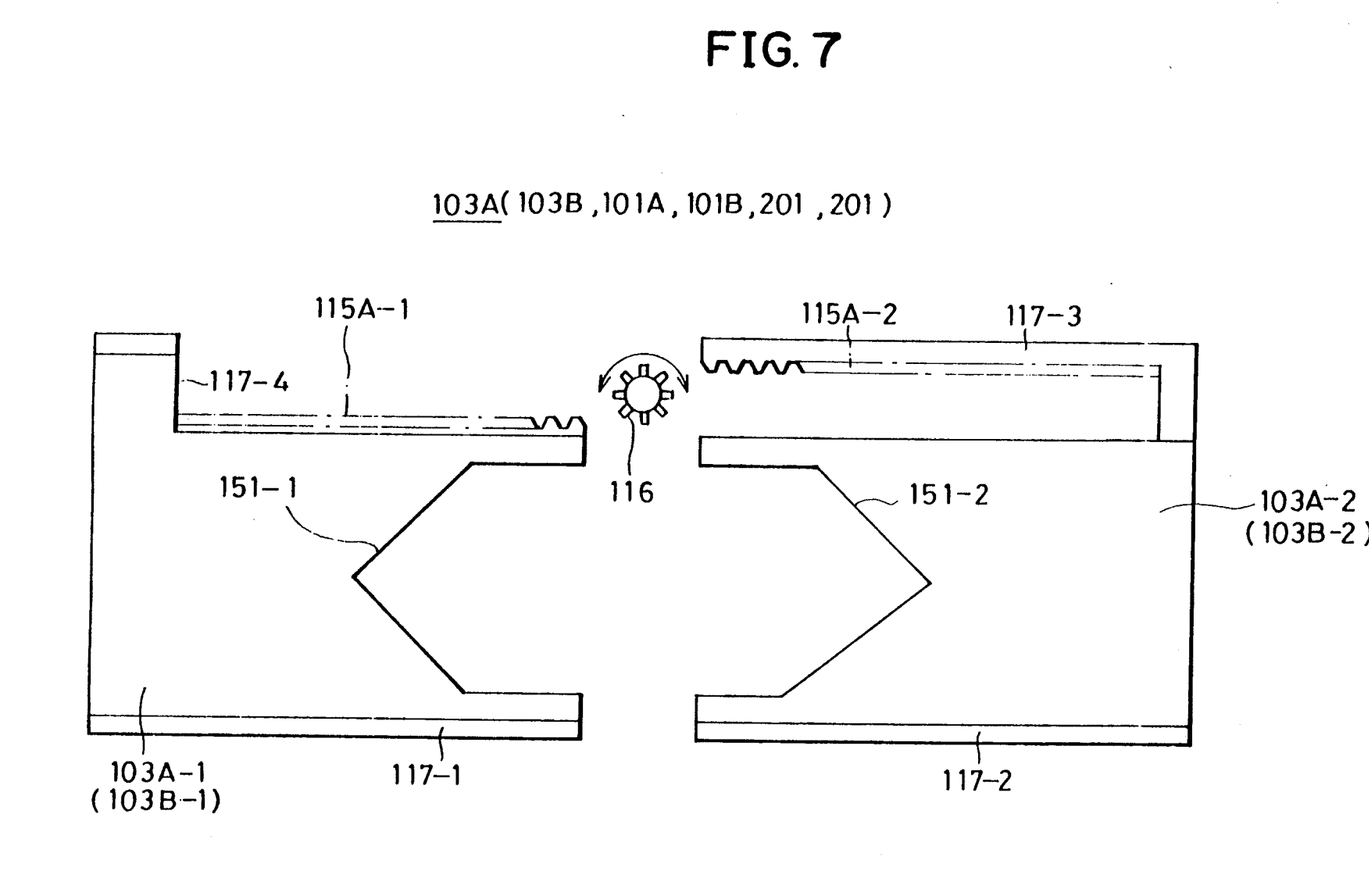
FIG. 7 is a diagram showing a shutter mechanism forming the essential part of the present invention in a state corresponding to FIG. 5(B)

Referring to FIG. 7, the shutter blades 103A-1 and 103A-2 are formed from Nb and have respective cutouts 151-1 and 151-2 in correspondence to the aperture for exposing the chip. Further, rack teeth 115A-1 of copper-beryllium alloy are provided on the shutter blade 103A-1 along an upper edge thereof. Along a bottom edge of the shutter blade 103A-1, on the other hand, there is provided a slider part 117-1 of copper-beryllium alloy for facilitating the movement of the shutter blade 103A-1. A similar slider part 117-2 of copper-beryllium alloy is also provided along a bottom edge of the shutter blade 103A-2.

The shutter blade 103A-2 further has an arm part 117-3 of copper-beryllium alloy extending to the left from the upper right corner of the blade 103A-2 along an upper edge thereof, and the arm part 117-3 is formed with rack teeth 115A-2 extending along a bottom edge of the arm part 117-3. It should be noted that these rack teeth 115A-1 and 115A-2 are formed to engage with a gear 116 that is provided on a frame 119 (not shown) to be described. Further, the shutter blade 103A-1 has a projection part 117-4 at the upper left portion thereof for stable, yet slidable mounting of the shutter blade 103A-1 on the frame 119.

Figure 8:
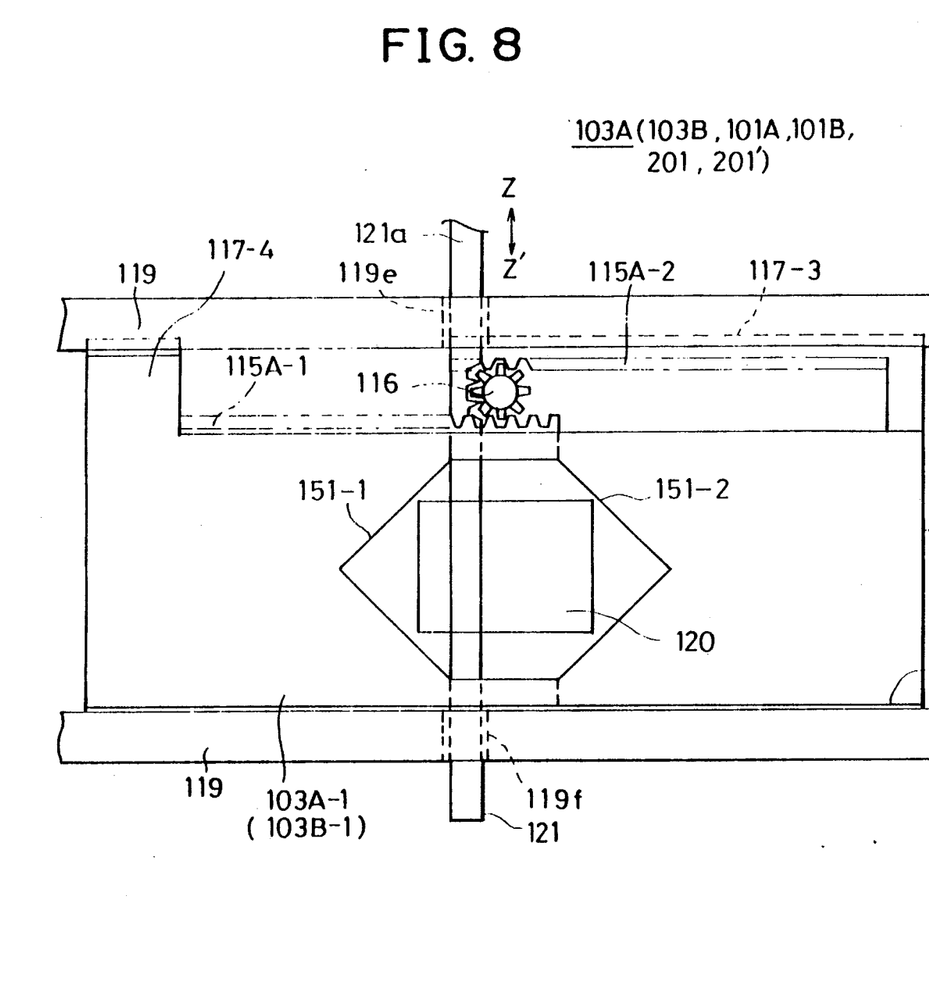
FIG. 8 is a diagram showing the shutter mechanism of FIG. 7 in a state intermediate between the state of FIG. 7 and the state of FIG. 4(B)
Figure 9:
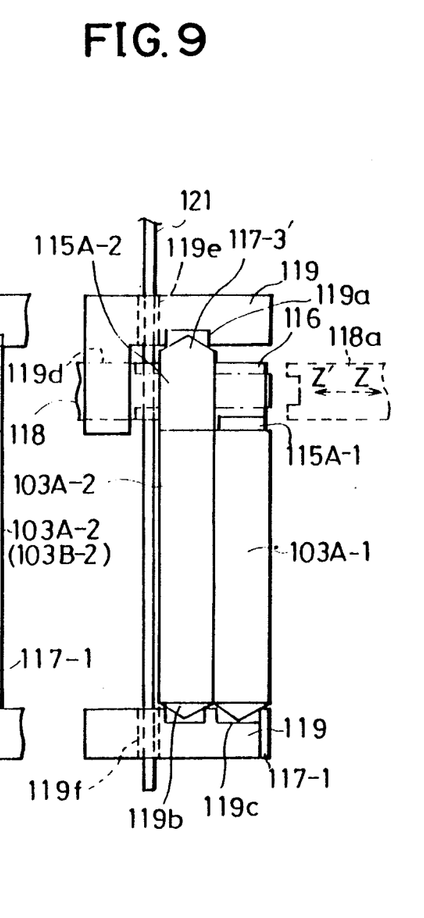
FIG. 9 is a diagram showing the side view of the structure of FIG. 8.

FIGS. 8 and 9 show the shutter blades 103A-1 and 103A-2 in the state as held in the frame 119, wherein FIG. 8 shows a front view and FIG. 9 shows a side view seen from the right.

Referring to FIG. 8, the shutter blade 103A-2 is located above the shutter blade 103A-1 in the direction perpendicular to the plane of the drawing, and is held by the frame 119 in a manner so as to be slidable freely along the frame 119. For this purpose, the frame 119 is formed with a groove 119a for engagement with an upper edge part of the arm 117-3 and an opposing groove 119b for engagement with a lower edge part of the slider 117-2 as illustrated in FIG. 9. Thereby, the shutter blade 103A-2 is held so as to be movable freely in the X—X' direction along the guide grooves 119a and 119b formed in the frame 119.

Similarly, the shutter blade 103A-1 is held so as to be movable on the frame 119 by engaging the lower edge of the slider 117-1 with a corresponding groove 119c and the upper edge of the projection 117-4 with a similar groove not shown in FIG. 8. Thereby, the shutter blade 103A-1 and the shutter blade 103A-2 make an intimate, yet slidable contact with each other as shown in the side view of FIG. 9.

Further, the frame 119 is formed with a penetrating opening (i.e., an aperture) 119d that holds rotatably a shaft 118 carrying the gear 116. Thereby, the gear 116 meshes with the corresponding rack teeth 115A-1 and 115A-2 on the respective shutter blades 103A-1 and 103A-2. In response to the rotation of the gear 116, the movable members 103A-1 and 103A-2 are moved laterally. It should be noted that the shaft 118 extends between a pair of opposing walls, 101A and 101B, or 103A and 103B, such that the rotation of the shaft 118 causes a simultaneous rotation of the respective gears 116 in both of the opposing walls. Thereby the movement of the movable members is caused in synchronization in the walls 101A and 101B or in the walls 103A and 103B, and the aperture that exposes the chip 120 is formed simultaneously in the opposing walls.

In the case that the illustrated wall is the wall 103A defining the side surface of the shield enclosure 100, the frame 119 is formed with still other openings 119e and 119f aligned in the direction perpendicular to the shaft 118, and a non-magnetic drive rod 121 is fitted into the openings 119e and 119f. The drive rod 121 is formed of a non-magnetic material having low thermal conductivity such a as copper-nickel alloy and is formed with teeth corresponding to the teeth of the gear 116. When inserted into the openings 119e and 119f, the teeth of the drive rod 121 meshes with the teeth of the gear 116 and rotates the same when the rod 121 is moved up and down in the direction Z—Z' shown in FIG. 8. Such a manipulation of the rod 121 is made from outside of the vessel 10 either directly or via a suitable transmission mechanism. The construction of the transmission mechanism will be omitted as such a mechanism is not different from other transmission mechanisms using meshing of various kinds of gears. The only difference would be the material forming the gears, as since organic lubricants such as mineral oil that are commonly used for transmission mechanisms cannot be used because of the extremely low temperature. In the present invention, the transmission mechanism is formed from the beryllium copper alloy that exhibits an excellent performance under such a low temperature environment without using organic lubricants.

In the case of providing the shutter blades shown in FIG. 7 on the wall 101A and 101B of FIG. 6, on the other hand, one may drive the gear 116 directly by connecting a Cu-Ni rod 118a extending in the Z-direction directly to the shaft 118 of the gear 116 and rotating the same from outside of the vessel 10. Further, the direction of movement of the shutter blades is not limited to the X—X' direction, but may be made in other directions such as Y—Y' shown in FIG. 6.

Thus, in the construction of FIG. 8, the shutter blades 103A-1 and 103A-2 are moved respectively to the right and to the left to close the aperture formed by the cutouts 151-1 and 151-2 when the rod 120 is pushed in the Z'-direction. On the other hand, when the rod 120 is pulled up in the Z direction, the shutter blade 103A-1 is moved to the left while the shutter blade 103A-2 is moved to the right. Thereby, the aperture is opened. As already described, by moving the shutter blades to open the aperture such that the superconducting integrated circuit chip 120 is exposed through the aperture as shown in FIG. 8 while maintaining the shutter blades in the superconducting state, the residual magnetic flux R is transported away from the chip 120 as long as the chip 120 is held in the normal conduction state. Thus, an effective elimination of trapping of the magnetic field can be achieved.

In the present embodiment, it should be noted that the material for the enclosure walls 101A through 103B is not limited to Nb, but any other superconductors such as niobium nitride having the critical temperature of 15° K. or other high Tc superconductors may be employed. From the view point of keeping the superconducting circuit chip 120 in the normal conduction state during the process of moving the shutter blade, it is preferred to use a material that has a high critical temperature of normal conduction-superconduction transition for the enclosure walls.

Further, the apparatus of the present invention can be used to construct a magnetically shielded room particularly when the high Tc superconductors are used. For example, when a superconductor oxide such as $YBa_2Cu_3O_{7-x}$ having the critical temperature exceeding 90° K. is used, the cooling by the liquid helium is not necessary and one may design the magnetic shield enclosure 100 to define a large space therein for incorporating objects for various physical as well as biological measurements. It should be noted that, in such a case, the object needs not to be a superconductor or superconducting circuit chip but may be any other objects including biological body.

Figure 10:
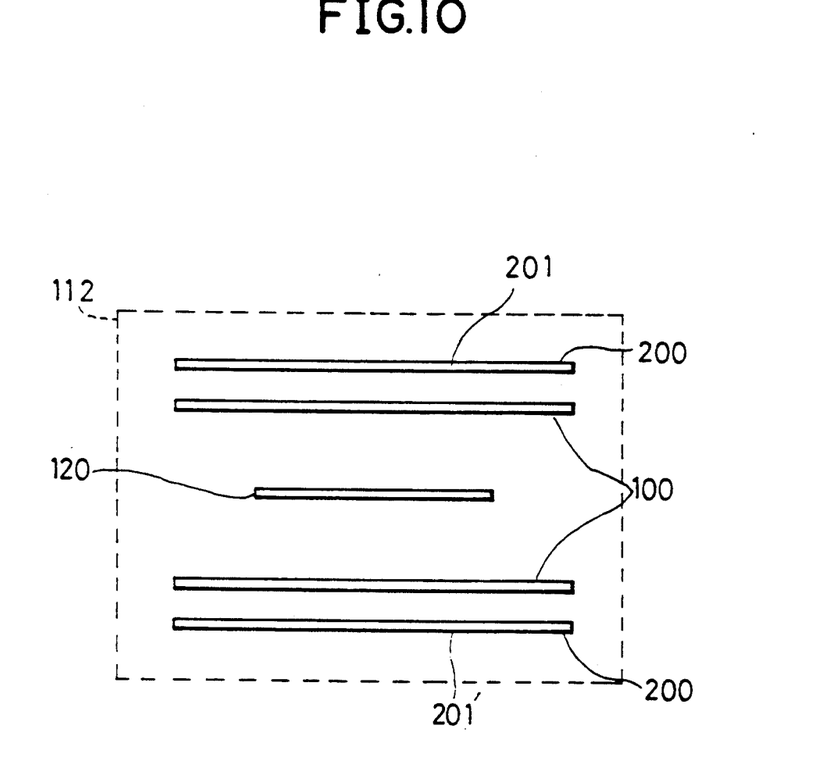
FIG. 10 is a diagram showing the essential part of a second embodiment of the present invention.

FIG. 10 shows a second embodiment of the present invention. In FIG. 10, only the essential feature is shown and the illustration of detailed structural features will be omitted.

Referring to FIG. 10, the apparatus of the present embodiment has an additional superconductor enclosure 200 at the outside of the superconductor enclosure 100 but within the permalloy enclosure 112. The additional enclosure 200 has a structure identical with the enclosure 100 and have upper and lower walls 201 and 201' wherein the shutter blades similar to the shutter blades 103A-1 and 103A-2 described with reference to FIGS. 7-9 are provided, except that the shutter blades for the enclosure 200 can be operated independently from the shutter blades 103A-1 and 103A-2. Such a construction is easily achieved by shifting the location of the drive gear such as the gear 116 in the inner enclosure 100 and the outer enclosure 200. As the detailed construction of the upper and lower walls 201 and 201' is substantially identical with those already described, further description thereof will be omitted.

In operation, the outer enclosure 200 is first set to the superconducting state while maintaining the inner enclosure 100 and the chip 120 in the normal conduction state. In this state, the shutter blades of the outer enclosure 200 are moved and the magnetic fluxes that are pinned in the superconducting outer enclosure 200 are displaced to the outside of the chip 120. Next, the inner enclosure 100 is set to the superconducting state and the remaining magnetic fluxes, if any, are pinned therein. Further, the shutter blades of the enclosure 100 are moved laterally and the remaining magnetic fluxes are displaced together with the movement of the shutter blades. Of course, the chip 120 is held in the normal conduction state during this process, and the removal of the magnetic flux is made without substantial resistance. Thereby, the elimination of the magnetic flux interlinking the chip or object 120 can be made perfectly.

In order to cause the transition to the superconduction state in the outer enclosure 200 first and subsequently in the inner enclosure 100, one may choose the materials for the enclosures such that the material forming the outer enclosure 200 has a higher critical temperature of superconduction-normal conduction transition while the material forming the inner enclosure 100 has a lower critical temperature. Alternatively, one may change the length of the thermally conductive strip 113 connecting the enclosures 100 and 200 to the chilling head 114 in the enclosure 100 and the enclosure 200.

It should be noted that the effect of removal of the magnetic flux is increased with an increasing number of enclosures used in the embodiment of FIG. 10, as each such enclosure provides a new environment from which the removal of the magnetic flux is started, contrary to the case of using the permalloy shielding where there exists a limit in the number of multifold enclosures because of the magnetic saturation.

By employing the present invention for the superconducting logic circuits forming a computer system, for example, one can eliminate the erroneous operation caused by the external magnetic fields.

In order to utilize the present invention efficiently, it is preferred to set the distance $d$ defined in FIG. 5(A) as the distance between the superconducting shutter wall 11 and the chip 12 to be at least equal to or smaller than the distance $l$ measured from the outer edge of the superconducting shutter 11 to the outer edge of the chip 12.

Further, the present invention is not limited to the embodiments described heretofore, but various variations and modifications may be made without departing from the scope of the invention.

What is claimed is:

1. A magnetic shielding apparatus for eliminating the interlinking of magnetic flux with an object, comprising:

a first superconductor wall provided at one side of the object to which the magnetic flux is interlinking and disposed to intersect with the interlinking magnetic flux, said interlinking magnetic flux passing through the object in a first direction;

a second superconductor wall provided at the other, opposing side of the object and disposed to intersect with the interlinking magnetic flux that has passed through the object;

said first and second superconductor walls being formed of a superconductor material that experiences a transition from a normal conduction state to a superconduction state upon cooling below a critical temperature, said first superconductor wall having first and second movable members, each of the superconductor material, disposed for movement with respect to each other in a second direction different from the first direction and between a first position wherein the first and second movable members conceal the object when viewed in the first direction and a second position wherein the first and second movable members form an aperture through which the object is exposed when viewed in the first direction, said second superconductor wall having first and second movable members corresponding to the first and second movable members of the first superconductor wall respectively and movable with respect to each other in the second direction between a first position wherein the first and second movable members of the second superconductor wall conceal the object when viewed in the first direction and a second position wherein the first and second movable members of the second superconductor wall form an aperture that is aligned with the aperture formed in the first superconductor wall and through which the object is exposed when viewed in the first direction;

driving means, connected mechanically to the first and second movable members of the first superconductor wall and further to the first and second movable members of the second superconductor wall, for moving the first and second movable members of the first superconductor wall between the first and second positions thereof, and for moving the first and second movable members of the second superconductor wall between the first and second positions thereof; and cooling means connected to each of the first and second movable members of the first and second superconductor walls for cooling the same below the critical temperature.

2. A magnetic shielding apparatus as claimed in claim 1 in which said driving means moves the first and second movable members of the second superconductor wall substantially in synchronization with the first and second movable members of the first superconductor wall.

3. A magnetic shielding apparatus as claimed in claim 1 in which said magnetic shielding apparatus further comprises a magnetic shielding enclosure that accommodates said magnetic shielding apparatus therein, said magnetic shielding enclosure shielding the magnetic shielding apparatus magnetically from any external magnetic field.

4. A magnetic shielding apparatus as claimed in claim 3 in which said magnetic shielding enclosure comprises a third superconductor wall provided adjacent to the first superconductor wall at a side away from the object to intersect the interlinking magnetic flux, a fourth superconductor wall provided adjacent to the second superconductor wall at a side away from the object, to intersect the interlinking magnetic flux, said third and fourth superconductor walls being formed of a second superconductor material that experiences a transition from a normal conduction state to a superconduction state upon cooling below a second critical temperature, said third superconductor wall having first and second movable members of the second superconductor material, arranged so as to be movable with respect to each other in a third direction different from the first direction between a first position wherein the first and second movable members of the third superconductor wall conceal the first superconductor wall when viewed in the first direction, and a second position wherein the first and second movable members of the third superconductor wall form an aperture through which the first superconductor wall is exposed when viewed in the first direction, said fourth superconductor wall having first and second movable members respectively corresponding to the first and second movable members of the third superconductor wall and movable with respect to each other in the third direction, between a first position wherein the first and second movable members of the fourth superconductor wall conceal the object when viewed in the first direction, and a second position wherein the first and second movable members of the fourth superconductor wall form an aperture that is aligned with the aperture formed in the third superconductor wall and through which the second superconductor wall is exposed when viewed in the first direction, and second driving means connected mechanically to the first and second movable members of the third superconductor wall and further to the first and second movable members of the fourth superconductor wall, for moving the first and second movable members of the third superconductor wall between the first and second positions thereof, and for moving the first and second movable members of the fourth superconductor wall between the first and second positions thereof, said third and fourth superconductor walls being connected to the cooling means such that the third and fourth superconductor walls are cooled below the second critical temperature.

5. A magnetic shielding apparatus as claimed in claim 4 in which said second critical temperature of the second superconductor material is higher than the critical temperature of the superconductor material forming the first and second superconductor walls.

6. A magnetic shielding apparatus as claimed in claim 4 in which said second critical temperature of the second superconductor material forming the third and fourth superconductor walls is identical with the superconductor material forming the first and second superconductor walls, and said third and fourth superconductor walls are connected to the cooling means such that the third and fourth superconductor walls undergo the transition to the superconducting state before the first and second superconductor walls experience the transition to the superconducting state.

7. A magnetic shielding apparatus as claimed in claim 4 in which said second driving means moves the first and second movable members of the third and fourth superconductor walls independently of the first and second movable members of the first and second superconductor walls.

8. A magnetic shielding apparatus as claimed in claim 1 in which each of said first and second superconductor walls comprises a frame that supports the first and second movable members so as to be slidable in the second direction, and each of said first and second superconductor walls has an engaging part disposed in a slidable engagement with the frame, said frame including a groove therein for accepting the engaging part in said slidable engagement.

9. A magnetic shielding apparatus as claimed in claim 8 in which each of said frame and said engaging part is made of a copper-beryllium alloy.

10. A magnetic shielding apparatus as claimed in claim 8 in which said driving means for driving the first and second movable members of the first and second superconductor walls comprises a drive gear mounted rotatably on the frame and a toothed region formed in each of the first and second movable members for engagement with the drive gear, said drive gear and the toothed regions on the first and second movable members being disposed such that rotation of the drive gear in one direction causes the movement of the first movable member in a fourth direction parallel to the second direction and the movement of the second movable member in a fifth direction that is parallel to the second direction yet opposite to the fourth direction.

11. A magnetic shielding apparatus as claimed in claim 10 in which said drive means further comprises a drive rod defining an axis and having a rack of parallel-axially aligned teeth thereon engaged with the drive gear, said drive gear being rotated by axially moving the drive rod.

12. A magnetic shielding apparatus as claimed in claim 11 in which said drive gear comprises a copper-nickel alloy.

13. A magnetic shielding apparatus for eliminating trapping a magnetic flux within a superconducting device received within and shielded by the magnetic shielding apparatus, said superconducting device having an upper major surface and a lower major surface and exhibiting a normal conduction-superconduction transition at a first critical temperature and operating at a temperature below the first critical temperature, said apparatus comprising:
an adiabatic vessel defining an interior space therewithin for receiving the superconducting device and also accommodating a cooling medium for cooling the superconducting device below the first critical temperature, such that the cooling medium experiences minimum heat penetration from the exterior of the adiabatic vessel;

a first magnetic shielding enclosure, accommodated in the interior space within the adiabatic vessel and surrounding a first region within the interior space of the adiabatic vessel, which prevents magnetic fluxes from penetrating into the first region; and a second magnetic shielding enclosure accommodated in the first region defined by the first magnetic shielding enclosure and surrounding a second region within the first region, the second region accommodating therein the superconducting device, said second magnetic shielding enclosure comprising a superconductor material having a second critical temperature that is equal to or higher than the first critical temperature, and at least having a first side facing the upper major surface of the superconducting device and a second side facing the lower major surface of the superconducting device, each of said first and second sides having first and second movable members of the superconductor material and which are movable in a direction substantially parallel to the upper and lower major surfaces between a first position wherein the first and second movable members conceal the superconducting device when viewed in a direction perpendicular to the first and second sides of the second magnetic shielding enclosure, and a second position wherein the first and second movable members form an opening through which the superconducting device is exposed when viewed in a direction perpendicular to the first and second sides to the second magnetic shielding enclosure, driving means, operable from the exterior of the adiabatic vessel, for moving the first and second movable members between the first and second positions, refrigerating means, provided in the interior space defined by the adiabatic vessel and connected thermally to the second magnetic shielding enclosure, for causing the transition of the superconducting device to the superconduction state by cooling the second magnetic shielding enclosure.

14. A magnetic shielding apparatus as claimed in claim 13 in which said superconducting material of the second magnetic shielding enclosure is selected such that the second critical temperature is higher than the first critical temperature.

15. A method of eliminating magnetic flux from an object, comprising the steps of:

providing a pair of superconductor plates and relatively disposing same to define a space therebetween within which the object is accommodated, said superconductor plates being disposed so as to intersect the magnetic flux that is interlinking the object while maintaining a normal conduction state such that the magnetic flux passes freely through the pair of superconductor plates;

causing a transition of the pair of superconductor plates to a superconduction state and thereby producing pinning of the magnetic flux in the pair of superconductor plates; and moving the superconductor plates, while both maintaining the pinning of the magnetic flux therein and maintaining the object in the normal conduction state, to a position offset from the object.

* * * * *

UNITED STATES PATENT AND TRADEMARK OFFICE
CERTIFICATE OF CORRECTION

PATENT NO. : 5,164,696
DATED : November 17, 1992
INVENTOR(S) : Seigo KOTANI

It is certified that error appears in the above-indentified patent and that said Letters Patent is hereby corrected as shown below:

Title Page, Item [56] References Cited - U.S. PATENT DOCUMENTS:
third reference, change "4,646,047" to --4,646,046--.

Col. 2, line 66, change "interlinks" to --interlink--.

Col. 3, line 52, change "planer" to --planar--.

Col. 4, line change "11B'" to --11B-- and change "11B''" to --11B'--.

Col. 5, line 12, change "X-direction" to --X'-direction--.

Col. 6, line 33, after "in" insert --the--;
line 34, after "tive" insert --,--;
line 40, change "11c" to --11C-- and change "11c'" to --11C'--.

Col. 8, line 10, change "a as" to --as a--;
line 22, delete "as";
line 61, change "view point" to --viewpoint--.

UNITED STATES PATENT AND TRADEMARK OFFICE
CERTIFICATE OF CORRECTION

PATENT NO. : 5,164,696
DATED : November 17, 1992
INVENTOR(S) : Seigo KOTANI

It is certified that error appears in the above-indentified patent and that said Letters Patent is hereby corrected as shown below:

Col. 9, line 10, change "objects" to --object--;
line 11, before "biological" insert --a--;
line 21, change "have" to --has--.

Signed and Sealed this

Twenty-first Day of June, 1994

Attest:

BRUCE LEHMAN

Attesting Officer       Commissioner of Patents and Trademarks